US011756783B1

(12) United States Patent
Prophet et al.

(10) Patent No.: US 11,756,783 B1
(45) Date of Patent: Sep. 12, 2023

(54) METHOD FOR CREATING CAVITIES IN SILICON CARBIDE AND OTHER SEMICONDUCTOR SUBSTRATES

(71) Applicant: HRL Laboratories, LLC, Malibu, CA (US)

(72) Inventors: Eric Prophet, Malibu, CA (US); Joel Wong, Agoura Hills, CA (US); Florian G. Herrault, Agoura Hills, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 162 days.

(21) Appl. No.: 17/345,932

(22) Filed: Jun. 11, 2021

Related U.S. Application Data

(60) Provisional application No. 63/067,511, filed on Aug. 19, 2020.

(51) Int. Cl.
  *H01L 21/02*  (2006.01)
  *H01L 21/268* (2006.01)
  *B23K 26/40*  (2014.01)
  *B23K 101/40* (2006.01)

(52) U.S. Cl.
  CPC ........ *H01L 21/02035* (2013.01); *B23K 26/40* (2013.01); *H01L 21/02013* (2013.01); *H01L 21/02016* (2013.01); *H01L 21/268* (2013.01); *B23K 2101/40* (2018.08)

(58) Field of Classification Search
  CPC ......... H01L 21/02035; H01L 21/02013; H01L 21/02016; H01L 21/268; B23K 26/40; B23K 2101/40
  See application file for complete search history.

(56) References Cited

U.S. PATENT DOCUMENTS 8,003,441 B2 * 8/2011 Maeda ................... H01L 24/27
                                                        438/464

* cited by examiner

*Primary Examiner* — Cuong B Nguyen
(74) *Attorney, Agent, or Firm* — Ladas & Parry, LLP

(57) ABSTRACT

A method for creating at least one cavity in a semiconductor substrate including the steps of:
(a) partially ablating the semiconductor substrate from the top side with a laser to form a trench in the semiconductor substrate surrounding a cross section of the semiconductor material having the desired shape,
(b) machining the backside of the semiconductor substrate partially ablated in step (a) to reduce the semiconductor substrate to a final thickness that is equal to or less than the laser ablation depth to form a plug of semiconductor material unattached to a remainder of the semiconductor substrate; and
(c) removing the plug of semiconductor material from the semiconductor substrate to form the at least one cavity with cross section of desired shape extending through the semiconductor substrate.

24 Claims, 4 Drawing Sheets

Partially ablating a top side of a semiconductor substrate with a laser to form a trench defining a cavity of desired shape in the semiconductor substrate — 110

Temporarily mounting the partial-ablated semiconductor substrate onto a carrier with the top side of the semiconductor substrate facing the carrier — 120

Machining the backside of the partially-ablated semiconductor substrate to reduce the thickness of the semiconductor substrate sufficiently to detach a plug of semiconductor material within the cavity from a remainder of the semiconductor substrate — 130

Removing the substrate from the carrier to recover a stand-alone semiconductor substrate with cavity of the desired shape — 140

METHOD FOR CREATING CAVITIES IN SILICON CARBIDE AND OTHER SEMICONDUCTOR SUBSTRATES

CROSS REFERENCE TO RELATED APPLICATIONS

This application claims the benefit of U.S. Provisional Patent Application No. 63/067,511 filed Aug. 19, 2020, the disclosure of which is hereby incorporated herein by reference.

GOVERNMENT LICENSE RIGHTS

This invention was made with government support under U.S. Government Contract Number FA8650-13-C-7324. The government may have certain rights in the invention.

FIELD OF THE INVENTION

The invention is directed to a method for reliably creating a single cavity or multiple cavities in semiconductor substrates such as silicon carbide (SiC) and single crystal silicon substrates while preventing cracking in surrounding bulk material.

BACKGROUND OF THE INVENTION

Silicon carbide (SiC) is a preferred material for manufacturing semiconductor devices due to its excellent physical and chemical properties, such as its wide bandgap, high critical breakdown field strength, high electron saturation velocity, high thermal conductivity and stability, and chemical inertness. SiC devices are preferable to silicon devices, especially in high temperature environments. But, SiC is a brittle and hard material and cracks can easily propagate on the machined surface of SiC. The conventional machining processes of SiC wafers, which include slicing, lapping, and polishing, can result in surface and subsurface cracking.

Dry etching techniques have also been used to selectively remove silicon carbide. These are typically used to remove relatively thin layers of silicon carbide. The etch rates are nominally around 1500 angstroms/minute up to about 10000 angstroms/minute using tools such as deep reactive ion etching (DRIE). These methods are not practical for substrate thicknesses on the order of several hundreds of micrometers (e.g. 500 microns). Chemical and dry etching processes are expensive and are not feasible commercially due to prohibitively long etch times and masking limitations for thicker substrates.

What is needed is a method for easily and reliably creating cavities in a bulk substrate, such as silicon carbide, that is hard and/or brittle so as to avoid the expense and impracticality of chemical and dry etching processes on the one hand and to avoid the cracking problems inherent with conventional direct milling methods on the other.

SUMMARY OF THE INVENTION

The present invention enables the creation of cavities and vias through full thickness semiconductor wafers (500 microns and greater) made of silicon carbide and other hard and/or brittle semiconductor material. The method uses a laser to target the bulk of the substrate thickness without penetrating the entire substrate, keeps the crystal structure intact and substantially prevents subsequent cracking. The laser also creates rounded corners that reduce stress concentration points to prevent additional cracking.

In accordance with one embodiment of the invention, there is provided a method comprising creating a plurality of cavities with fine and large features of between 100-500 microns in a given dimension in a high hardness material using maskless technology, wherein the cavities are created without forming cracks in the material.

In accordance with another embodiment of the invention, there is provided a method comprising creating a plurality of cavities with fine features of between 100-500 microns in a given dimension in a brittle material having a thickness of at least 300 microns using maskless technology, wherein the cavities are created without forming cracks in the material.

In accordance with a further embodiment of the invention, there is provided a method for creating at least one cavity in a semiconductor substrate, wherein the cavity has a cross section of a desired shape and extends through the semiconductor substrate, wherein the semiconductor substrate comprises at least a top side, an opposed backside and a substrate thickness as measured from the top side to the backside, and wherein the semiconductor substrate comprises a semiconductor material that makes it susceptible to formation of surface or subsurface cracks when the cavity is created solely by mechanical milling. The method comprises the steps of:

(a) partially ablating the semiconductor substrate from the top side with a laser to form a trench in the semiconductor substrate surrounding a cross section of the semiconductor material having the desired shape, wherein the trench extends to a laser ablation depth that covers a major portion of the substrate thickness and leaves only a minor portion of the substrate thickness remaining unablated below the trench-surrounded semiconductor material;

(b) machining the backside of the semiconductor substrate partially ablated in step (a) to reduce the semiconductor substrate to a final thickness that is equal to or less than the laser ablation depth whereby to form a plug of semiconductor material unattached to a remainder of the semiconductor substrate; and (c) removing the plug of semiconductor material from the semiconductor substrate to form the at least one cavity with cross section of desired shape extending through the semiconductor substrate.

In a preferred aspect of this embodiment, the method comprises prior to step (b) temporarily mounting the semiconductor substrate partially ablated in step (a) onto a carrier with the top side of the semiconductor substrate facing the carrier. The partially-ablated semiconductor substrate is preferably mounted onto the carrier with a bonding material and step (b) comprises releasing the plug of semiconductor material from the bonding material. In a preferred aspect of this embodiment, the bonding material is selected from the group consisting of tape, wax, or other temporary bonding agent such as Brewer Science WaferBOND® CR 200. The partially-ablated semiconductor substrate may be mounted onto the carrier by a thermal bonding process in which a bonding material that is activated by heat is raised to a temperature sufficient to activate it.

In another preferred aspect of this embodiment, the semiconductor material is a hard or brittle material selected from the group consisting of SiC, GaN, single crystal silicon and sapphire. In a most preferred aspect of this embodiment, the semiconductor material is SiC.

In yet another preferred aspect of this embodiment, the substrate thickness before the reduction in step (b) is at least 100 μm and is preferably at least 500 μm.

In a still further preferred aspect of this embodiment, the trench formed in step (a) extends through 80-99% of the substrate thickness, preferably extends through 90-99% of the substrate thickness, more preferably extends through 95-99% of the substrate thickness, and most preferably extends through 98-99% of the substrate thickness.

In yet a further preferred aspect of this embodiment, the cross section of the cavity is in the shape of a rectangle with rounded corners.

In yet another preferred aspect of this embodiment, the machining in step (b) comprises mechanical grinding, polishing or both.

In a still further preferred aspect of this embodiment, the cavity is formed without chemical or dry etching.

DETAILED DESCRIPTION

As used herein, the term "brittle" substrate is used to designate a substrate with a fracture toughness $K_{Ic}$ of less than 4 MPa·m$^{1/2}$. A "hard" substrate or substrate of "high hardness" is used to designate a substrate with a Moh's hardness of at least 6. The term "maskless technology" is used to designate a process where the features are defined directly using a laser's numerical coding interface, and does not require external or additional masking layers.

In a preferred embodiment, the invention is directed to a method that uses a combination of mechanical milling, grinding and/or polishing to create cavities in hard and/or brittle substrates without cracking in the substrate material surrounding the cavities. Preferably, the method is a combination of mechanical milling by means of laser ablation and mechanical grinding and/or polishing. The goal is to mill down through most of the substrate using a laser from the top side and to finish off the process using a backside grind and/or polishing step to release cavity plug material formed by the milling step. This keeps the crystal structure of a substrate intact during the more aggressive milling step.

Although any laser is suitable for use in the invention, in a most preferred embodiment the laser ablation is done using a waterjet guided laser in which a pulsed laser beam is coupled into a high pressure water jet. By way of example, a Synova LDS 300M waterjet guided laser may be used. This laser itself is a diode pumped solid state pulsed Nd:Yag. The operating wavelength of the laser is 532 nm (green), the pulse width is 4 micro-seconds, and the repetition rate is 12 kHz. The power can be optimized depending on the wafer thickness. In the case of a 500 um thick SiC wafer, the power setting is optimally around 13.5 W. The laser spot size is 40 um, and the linear feed speed is 10 mm/s. The water jet pressure may be set to around 400 bar.

Figure 1A:
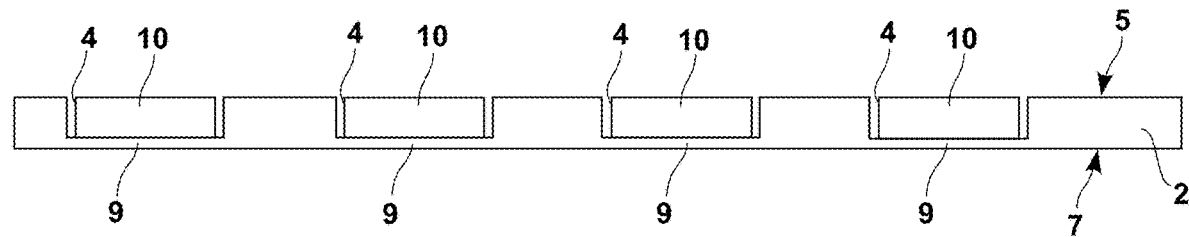
FIG. 1A is a cross-sectional view of a semiconductor substrate partially ablated by a laser as an initial step in a method for defining cavities in the substrate.
Figure 1B:
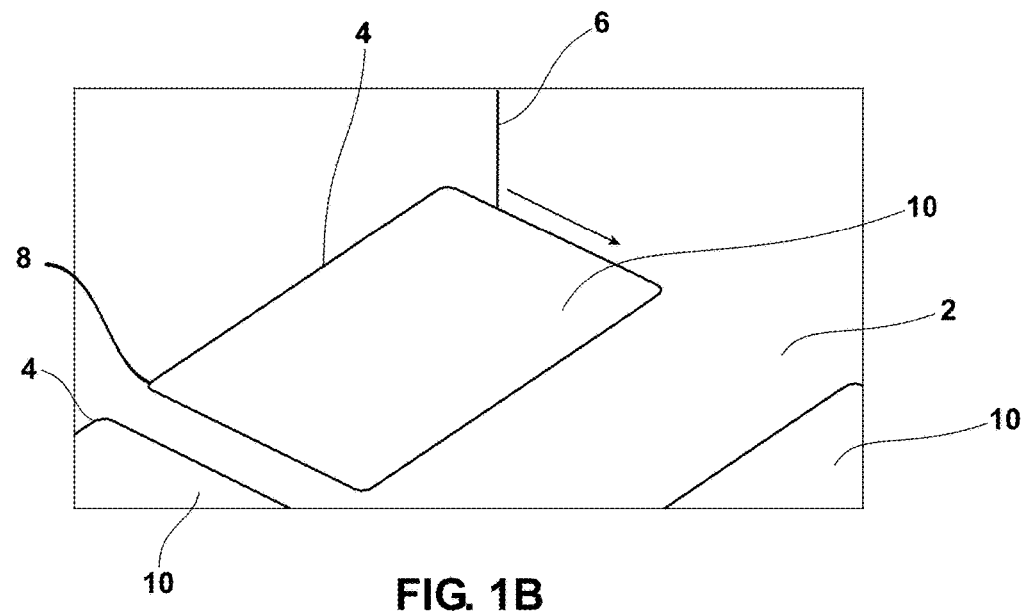
FIG. 1B is a perspective view of an enlarged portion of the semiconductor substrate partially ablated by a laser in FIG. 1A.
Figure 7:
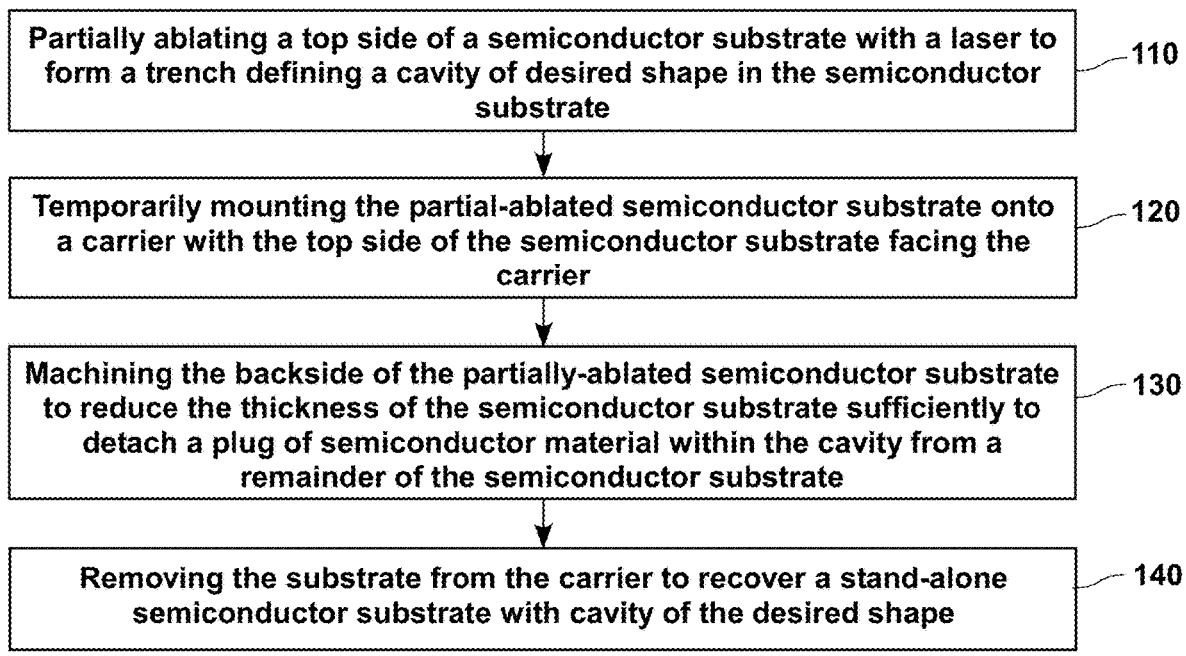
FIG. 7 depicts a preferred method for creating cavities in a semiconductor substrate.

FIG. 7 provides an overview of the steps of the preferred method. Step 110 comprises a step of partially ablating a semiconductor substrate to form a trench around a desired cross section of the substrate with a laser. In a preferred embodiment, the trench extends to a laser ablation depth that covers a major portion of the substrate thickness and leaves only a minor portion of the substrate thickness remaining unablated below the trench-surrounded semiconductor material. A substrate partially ablated as in step 110 is depicted in FIGS. 1A and 1B.

Figure 2:
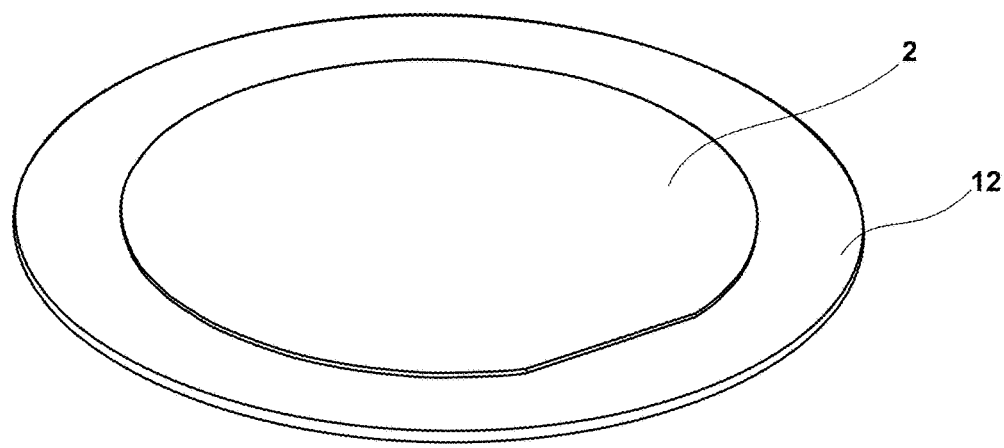
FIG. 2 is a perspective view of a partially ablated semiconductor substrate mounted face down on a carrier wafer.

Step 120 comprises a step of temporarily mounting the semiconductor substrate partially ablated in step 110 onto a carrier with the top side of the semiconductor substrate facing the carrier. FIG. 2 depicts a partially ablated semiconductor substrate so mounted.

Figure 3:
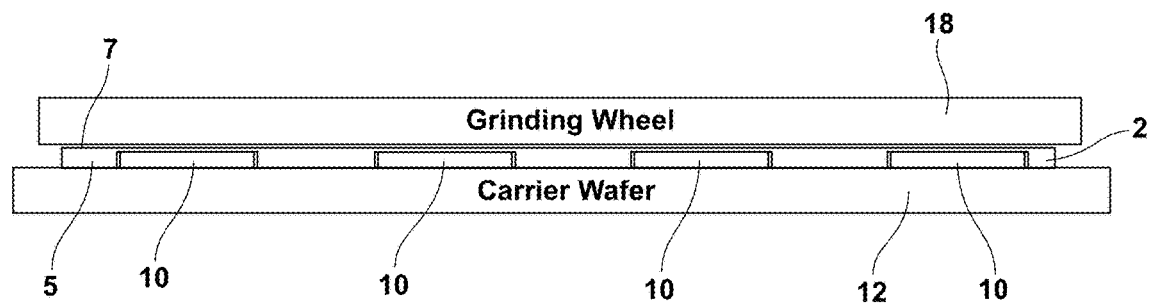
FIG. 3 is a cross section of a partially ablated semiconductor substrate mounted face down on a carrier wafer and with a grinding wheel poised to grind a backside of the semiconductor substrate to expose the laser milled trenches.
Figure 4:
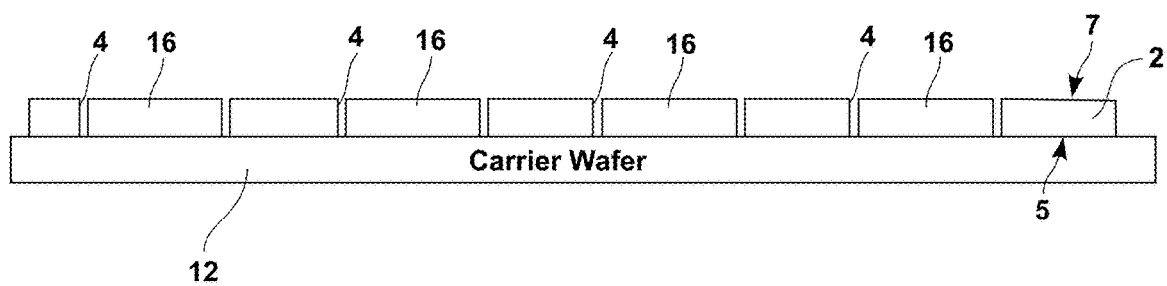
FIG. 4 is a cross section of a semiconductor substrate mounted face down on a carrier wafer after the grinding wheel has ground the backside of the wafer to expose the laser milled trenches and to release plugs of semiconductor material.

Step 130 comprises machining, as shown in FIG. 3, the backside of the semiconductor substrate partially ablated in step 110 to reduce the semiconductor substrate to a final thickness that is equal to or less than the laser ablation depth. This results in a plug of semiconductor material remaining unattached to a remainder of the semiconductor substrate, as shown in FIG. 4.

Figure 5:
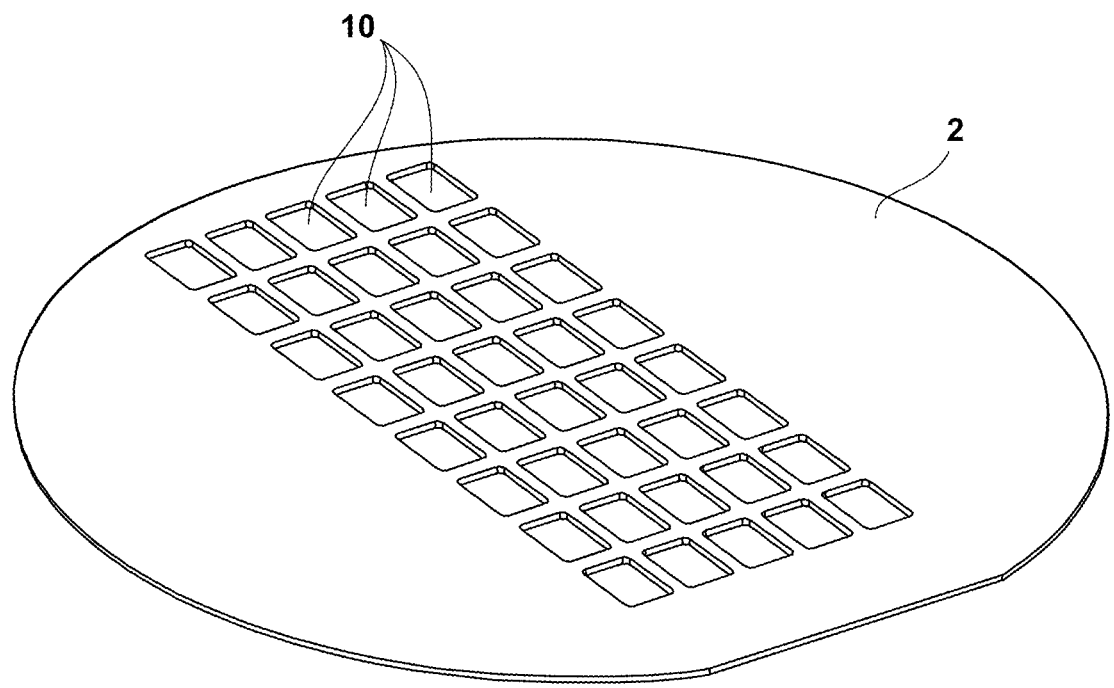
FIG. 5 is a perspective view of a semiconductor substrate after removal of the semiconductor material from the laser milled trenches.

Step 140 comprises removing the plug of semiconductor material from the semiconductor substrate and removing the semiconductor substrate from the carrier to form a standalone semiconductor substrate having cavities with cross section of desired shape extending therethrough, as shown in FIG. 5.

With specific reference to FIGS. 1A and 1B, there is shown a substrate 2 of semiconductor material with trenches 4 created by ablating a front side 5 of the substrate 2 with a laser 6 to define cavities 10 in the substrate of a desired cross-sectional shape. As can be seen in FIG. 1A, since the trenches 4 do not extend the full thickness of the substrate 2 to backside 7, minor portions 9 of semiconductor material remain unablated below the semiconductor material in the trench-surrounded cavities 10 attaching the semiconductor material in the trench-surrounded cavities 10 to the semiconductor material in the remainder of substrate 2. In a preferred embodiment, the semiconductor material is a hard or brittle material selected from the group consisting of SiC, GaN, single crystal silicon and sapphire. In a most preferred aspect of this embodiment, the semiconductor material is SiC.

The drawings show that a plurality of trenches 4 can be created by laser ablation, but the method could be used to create a single cavity as well. If a plurality of cavities is created, there is no maximum separation between the cavities, but a cavity should preferably not be too close to an edge of the substrate. In a preferred embodiment comprising a plurality of cavities, a cavity would not be closer than about 10 mm from an edge of the substrate. In another preferred embodiment comprising a plurality of cavities, adjacent cavities would not be closer than about 200 um from each other to provide a robust web between the cavities.

As can be seen in FIG. 1B, the desired cross-sectional shape of a cavity can be, but is not limited to, a generally rectangular cross section having rounded corners 8 to prevent stress concentration points that can promote cracking. The corners of any cavity, regardless of its geometry, should have some curvature to avoid creating any stress concentration points. A minimum corner curvature should be roughly 100 um—the larger the radius of curvature the better. Alternatively, the cavity can be round or of another shape that is without corners.

Preferably, the laser 6 is used to create laser mill cavities to less than 99% depth of the substrate. In other words, the laser ablates trenches having a depth that is not more than 99% of the initial thickness of the substrate. In a preferred embodiment, the trenches formed in step 110 extends through 80-99% of the substrate thickness, preferably extends through 90-99% of the substrate thickness, more preferably extends through 95-99% of the substrate thickness, and most preferably extends through 98-99% of the substrate thickness. In a preferred embodiment of the invention, the thickness of the substrate before the reduction in step 130 is at least 100 μm, is more preferably at least 300 μm and is most preferably at least 500 μm.

As shown in FIG. 2, the partially ablated substrate 2 may then be mounted with the ablated side 5 face down onto a carrier 12, which carrier may preferably be a carrier wafer. The substrate 2 is preferably mounted on the carrier 12 with a temporary bonding material, which can be for example tape, wax, or a temporary bonding agent such as Brewer Science WaferBOND® CR200, but can be any bonding material or method known in the art that enables easy release of the substrate from the carrier. In a preferred embodiment, the bonding material comprises a heat activated adhesive that will not become sticky unless it is heated to a threshold temperature. The substrate can be mounted on the carrier with thermal bonding by heating a heat-activated bonding material to a temperature sufficient to activate it.

As shown in FIG. 3, a grinding wheel 18 may then be disposed on the backside 7 of the ablated substrate 2 to thin the ablated substrate until the thickness of the substrate is reduced to a final substrate thickness that is equal to or lesser than the laser ablation depth. As shown in FIG. 4, this results in plugs 16 of semiconductor material within the trenches 4 that are unattached to the semiconductor material remaining in substrate 2. Although FIG. 3 depicts a grinding wheel for grinding the ablated substrate, one of skill in the art will readily appreciate that the machining in step 130 can comprise, by way of example, other forms of mechanical grinding, polishing or both.

After the machining in step 130, the substrate 2 may be released from the bond material and carrier separately from the plugs 16 to recover a standalone semiconductor substrate with cavities having cross section of desired shape extending through the semiconductor substrate, as shown in FIG. 5.

Example

Figure 6:
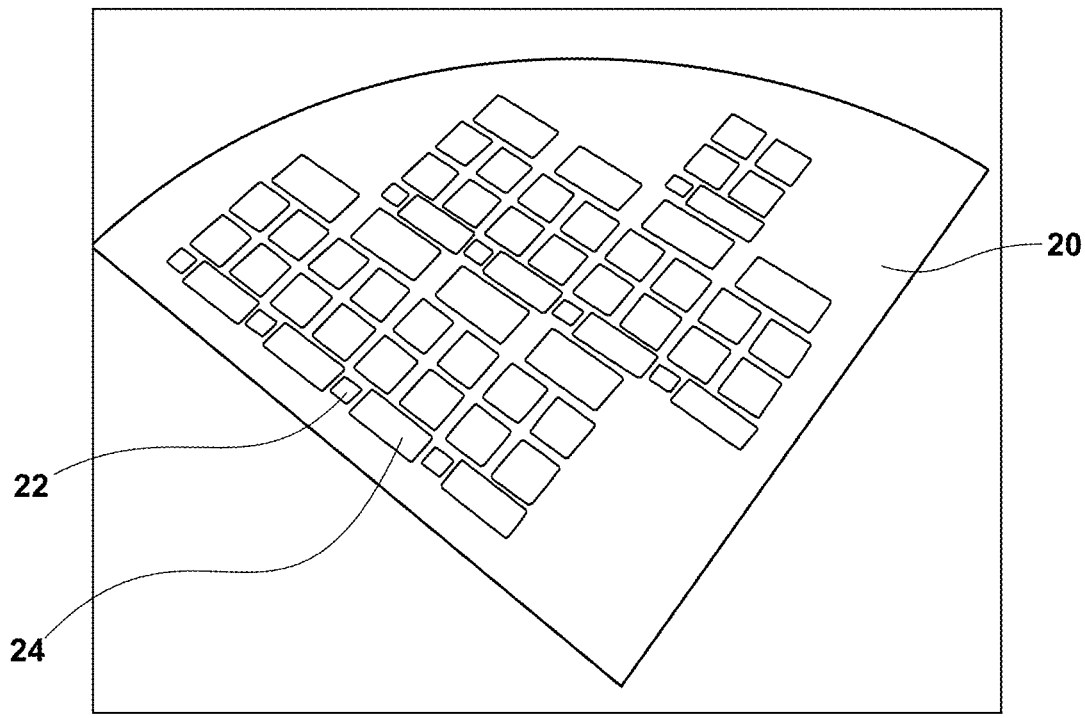
FIG. 6 is a perspective view of a 500 μm thick silicon carbide quarter wafer with multiple cavities formed by the method of the claimed invention.

The inventors have demonstrated the efficacy of the method using an aggressive high-density cavity pattern to prove the viability of the approach. FIG. 6 shows an example of the high-density pattern on a silicon carbide wafer 20 with an initial thickness of 500 microns. The substrate was ablated with a laser to form trenches with a depth extending within about 10% of the bottom of the substrate before the bottom of the substrate was polished back to release the resulting plugs. All of the cavities were observed to have been successfully released and the webbing between cavities is clean. No cracking was observed under high-power optical inspection.

As can also be seen from FIG. 6, the method enables the formation of patterns in a substrate wherein a first cavity with fine or small features is formed adjacent a second cavity having larger features. For example, a first cavity 22 having a spaced distance between oppositely facing inner sidewalls of no more than 200 microns or 100 microns can be formed adjacent a second cavity 24 having a spaced distance between oppositely facing inner sidewalls of 400 or 500 microns. Moreover, the first cavity having the fine features can be formed with an aspect ratio that is different than an aspect ratio of the second cavity. For example, the first cavity 22 can be formed with an aspect ratio as low as 1:1 wherein the second cavity 24 can be formed with an aspect ratio of 5:1 or higher.

As can be appreciated by those of skill in the art, the method described above enables the creation of cavities and vias through full thickness semiconductor wafers made of silicon carbide and other hard and/or brittle semiconductor material using maskless technology and without etching. The semiconductor substrates may have, by way of example, thicknesses between 100-500 microns in a given direction although, in a preferred embodiment, the substrate thickness will be at least 300 microns and may more preferably be 500 microns or greater. The method keeps the crystal structure of the substrate intact and substantially prevents cracking. The laser can also be used to create rounded corners that reduce stress concentration points additionally to prevent cracking.

The foregoing Detailed Description is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ".

What is claimed is:

1. A method for creating at least one cavity in a semiconductor substrate, wherein the at least one cavity has a cross section of a desired shape and extends through the semiconductor substrate, wherein the semiconductor substrate comprises at least a top side, an opposed backside and a substrate thickness as measured from the top side to the backside, and wherein the semiconductor substrate comprises a semiconductor material that makes it susceptible to formation of surface or subsurface cracks when the at least one cavity is created solely by mechanical milling, the method comprising the steps of:

(a) partially ablating the semiconductor substrate from the top side with a laser to form a trench in the semiconductor substrate surrounding a cross section of the semiconductor material having the desired shape, wherein the trench extends to a laser ablation depth that covers a major portion of the substrate thickness and leaves only a minor portion of the substrate thickness remaining unablated below the semiconductor material surrounded by the trench formed by the partial ablating;

(b) machining the backside of the semiconductor substrate partially ablated in step (a) to reduce the semiconductor substrate to a final thickness that is equal to or less than the laser ablation depth whereby to form a plug of the semiconductor material unattached to a remainder of the semiconductor substrate; and (c) removing the plug of semiconductor material from the semiconductor substrate to form the at least one cavity with cross section of desired shape extending through the semiconductor substrate.

2. The method according to claim 1, comprising prior to step (b) temporarily mounting the semiconductor substrate partially ablated in step (a) onto a carrier with the top side of the semiconductor substrate facing the carrier.

3. The method according to claim 2, wherein the semiconductor substrate partially ablated in step (a) is temporarily mounted onto the carrier with a bonding material and step (b) comprises releasing the plug of the semiconductor material from the bonding material.

4. The method according to claim 3, wherein the bonding material is selected from the group consisting of tape, wax, and CR 200 bonding material.

5. The method according to claim 3, wherein the bonding material comprises a heat-activated adhesive and the temporary mounting comprises activating the bonding material by application of heat.

6. The method according to claim 1, wherein the semiconductor material is a hard and/or brittle material selected from the group consisting of SiC, GaN, single crystal silicon and sapphire.

7. The method according to claim 1, wherein the semiconductor material is SiC.

8. The method according to claim 1, wherein the substrate thickness before the reduction in step (b) is at least 100 μm.

9. The method according to claim 1, wherein the substrate thickness before the reduction in step (b) is at least 500 μm.

10. The method according to claim 1, wherein the trench formed in step (a) extends through 80-99% of the substrate thickness.

11. The method according to claim 1, wherein the trench formed in step (a) extends through 90-99% of the substrate thickness.

12. The method according to claim 1, wherein the cross section of the cavity is substantially rectangular in shape.

13. The method according to claim 12, wherein the substantially rectangular shape has rounded corners having a radius of curvature of at least 100 um.

14. The method according to claim 1, wherein the machining in step (b) comprises mechanical grinding, polishing or both.

15. The method according to claim 1, wherein the at least one cavity is formed without chemical or dry etching.

16. The method according to claim 1, wherein the laser is a water-jet guided laser.

17. A method comprising creating a plurality of cavities in a substrate comprising a high hardness material having a crystal structure without cracking the crystal structure, the creating comprising a step of ablating a planar surface of the substrate with a laser to define boundaries of features of the plurality of cavities without ablating through an entire thickness of the substrate, and a step for removing substrate material from within the boundaries of the features of the plurality of cavities defined by the ablating without etching or masking, wherein the features comprise a dimension, as measured in a plane of a surface of the substrate, of at least 100 microns.

18. The method according to claim 17, wherein the plurality of cavities comprises adjacent first and second cavities that are not less than about 200 microns apart from each other and not closer than about 10 mm from an edge of the substrate.

19. The method according to claim 18, wherein the first cavity has an aspect ratio that is lower than 2:1 and the second cavity has an aspect ratio of at least 5:1.

20. The method according to claim 17, wherein the laser is a water-jet guided laser.

21. A method comprising creating a plurality of cavities in a substrate comprising a brittle material having a crystal structure without cracking the crystal structure, wherein the substrate has a thickness of at least 300 microns, the creating comprising a step of ablating a planar surface of the substrate with a laser to define boundaries of features of the plurality of cavities without ablating through the entire thickness of the substrate, and a step for removing substrate material from within the boundaries of the features of the plurality of cavities defined by the ablating without etching or masking, wherein the features comprise a dimension, as measured in a plane of a surface of the substrate, of at least 100 microns.

22. The method according to claim 21, wherein the plurality of cavities comprises adjacent first and second cavities that are not less than about 200 microns apart from each other and not closer than about 10 mm from an edge of the substrate.

23. The method according to claim 21, wherein the first cavity has an aspect ratio that is lower than 2:1 and the second cavity has an aspect ratio of at least 5:1.

24. The method according to claim 21, wherein the laser is a water-jet guided laser.

* * * * *